(12) United States Patent
Bawendi et al.

(10) Patent No.: US 6,914,265 B2
(45) Date of Patent: *Jul. 5, 2005

(54) QUANTUM DOT WHITE AND COLORED LIGHT EMITTING DIODES

(75) Inventors: Moungi G. Bawendi, Boston, MA (US); Jason Heine, Dallas, TX (US); Klavs F. Jensen, Lexington, MA (US); Jeffrey N. Miller, Los Altos Hills, CA (US); Ronald L. Moon, Atherton, CA (US)

(73) Assignees: Massachusetts Institute of Technology, Cambridge, MA (US); Lumileds Lighting U.S., LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/329,909

(22) Filed: Dec. 26, 2002

(65) Prior Publication Data

US 2003/0127660 A1 Jul. 10, 2003

Related U.S. Application Data

(63) Continuation of application No. 09/167,795, filed on Oct. 7, 1998, now Pat. No. 6,501,091.
(60) Provisional application No. 60/692,120, filed on Apr. 1, 1998.

(51) Int. Cl.$^7$ ........................ H01L 29/227; H01J 63/04
(52) U.S. Cl. ........................ 257/98; 257/100; 313/501; 313/502; 313/503
(58) Field of Search ........................ 257/98, 100, 14, 257/89; 313/501–503; 428/46, 372, 373, 474.4, 474.7, 403

(56) References Cited

U.S. PATENT DOCUMENTS

| | | | |
|---|---|---|---|
| 5,260,957 A | * 11/1993 | Hakimi et al. | 372/39 |
| 5,293,050 A | 3/1994 | Chapple-Sokol et al. | 257/17 |
| 5,354,707 A | 10/1994 | Sokol et al. | 437/106 |
| 5,422,489 A | 6/1995 | Bhargava | 250/488.1 |
| 5,505,928 A | 4/1996 | Alivisatos et al. | 423/299 |
| 5,585,640 A | 12/1996 | Huston et al. | 250/483.1 |
| 5,613,140 A | 3/1997 | Taira | 395/800 |
| 5,751,018 A | 5/1998 | Alivisatos et al. | 257/64 |
| 5,932,309 A | * 8/1999 | Smith et al. | 428/46 |
| 6,501,091 B1 | * 12/2002 | Bawendi et al. | 257/14 |

FOREIGN PATENT DOCUMENTS

WO     WO96/10282     4/1996

OTHER PUBLICATIONS

Margaret et al., Synthesis and Characterization of Strongly Luminescing ZnS–Capped CdSe Nanocrystals, 1996, J. Phys. Chem, vol. 100, No. 2, pp. 468–471.*

(Continued)

*Primary Examiner*—Minh-Loan Tran
(74) *Attorney, Agent, or Firm*—Choate, Hall & Stewart

(57) ABSTRACT

An electronic device comprising a population of quantum dots embedded in a host matrix and a primary light source which causes the dots to emit secondary light of a selected color, and a method of making such a device. The size distribution of the quantum dots is chosen to allow light of a particular color to be emitted therefrom. The light emitted from the device may be of either a pure (monochromatic) color, or a mixed (polychromatic) color, and may consist solely of light emitted from the dots themselves, or of a mixture of light emitted from the dots and light emitted from the primary source. The dots desirably are composed of an undoped semiconductor such as CdSe, and may optionally be overcoated to increase photoluminescence.

7 Claims, 2 Drawing Sheets

(1 of 2 Drawing Sheet(s) Filed in Color)

OTHER PUBLICATIONS

U.S. Appl. No. 09/167,795, Bawendi, et al., filed Oct. 7, 1998.

Murray, et al., "Synthesis and Characterization of Nearly Monodisperse CdE(E=S, Se, Te) Semiconductor Nanocrystallites," *J. Am. Chem. Soc.* 115(19):8706–8715, 1993.

Colvin, et al., "Light–emitting diodes made from cadmium selenide nanocrystals and a semiconducting polymer," *Nature* 370(6488):354–357, Aug. 4, 1994.

Dabbousi, et al., "Electroluminescence from CdSe quantum–dot/polymer composites," *Appl. Phys. Lett.* 66(11):1316–1318, Mar. 13, 1995.

Alivisatos, "Perspectives on the Physical Chemistry of Semiconductor Nanocrystals," *J. Phys. Chem.* 1996(100):13226–13239, 1996.

Danek, et al., "Synthesis of Luminescent Thin–Film CdSe/ZnSe Quantum Dot Composites Using CdSe Quantum Dots Passivated with an Overlayer of ZnSe," *Chem. Mater.* 8(1):173–180, 1996.

Matsumoto, et al., "Preparation of Monodisperse CdS Nanocrystals by Size Selective Photocorrosion," *J. Phys. Chem.* 100(32):13781–13785, 1996.

Diehl, "Fraunhofer LUCOLEDs to replace lamps," *III–Vs Rev.* 10(1), 1997.

Dabbousi, et al., "(CdSe)ZnS core–shell quantum dots: synthesis and characterization of a size series of highly luminescent nanocrystallites," *J. of Phys. Chem. B* 101(46):9463–9475, Nov. 13, 1997.

Guha, et al., "Hybrid organic–inorganic semiconductor–based light–emitting diodes," *J. Appl. Phys.* 82(8):4126–4128, Oct. 15, 1997.

Kortan, et al., "Nucleation and Growth of CdSe on ZnS Quantum Crystallite Seeds, and Vice Vesa, in Inverse Micelle Media," *J. Am. Chem. Soc.* 112:1327–1332, 1990.

Lawless, et al., "Bifunctional Capping of CdS Nanoparticles and Bridging to $TiO_2$," *J. Phys. Chem.* 99:10329–10335, 1995.

Hines, et al., "Synthesis and Characterization of Strongly Luminescing ZnS–Capped CdSe Nanocrystals," *J. Phys. Chem.* 100:468–471, Jan. 1996.

Empedocles, et al., "Photoluminescence Spectroscopy of Single CdSe Nanocrystallite Quantum Dots," *Phys. Rev. Lett.* 77(18):3873–3876, Oct. 1996.

Nirmal, et al., "Fluorescence Intermittency in Single Cadmium Selenide Nanocrystals," *Nature* 383:802–804, Oct. 1996.

Empedocles, et al., "Quantum–Confined Stark Effect in Single CdSe Nanocrystallite Quantum Dots," *Science* 278:2114–2117, Dec. 1997.

Kuno, et al., "The band edge luminescence of surface modified CdSe nanocrystallites: Probing the luninescing state," *J. Chem. Phys.* 106(23):9869–9882, Jun. 1997.

* cited by examiner

QUANTUM DOT WHITE AND COLORED LIGHT EMITTING DIODES

This application is a continuation of U.S. application Ser. No. 09/167,795, filed Oct. 7, 1998 now issued as U.S. Pat. No. 6,501,091, which claims benefit of U.S. Provisional Application 60/092,120, filed Apr. 1, 1998. Both of these related applications are incorporated herein by reference in their entirety.

This invention was made with government support under Contract Number 94-00034 awarded by the National Science Foundation. The government has certain rights in the invention.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

1. Field of the Invention

The present invention relates to the use of quantum dots in light emitting diodes. The invention further relates to a light emitting diode which emits light of a tailored spectrum of frequencies.

2. Background of the Invention

Light emitting diodes (LEDs) are ubiquitous to modern display technology. More than 30 billion chips are produced each year and new applications, such as automobile lights and traffic signals, continue to grow. Conventional diodes are made from inorganic compound semiconductors, typically AlGaAs (red), AlGaInP (orange-yellow-green), and AlGaInN (green-blue). These diodes emit monochromatic light of a frequency corresponding to the band gap of the compound semiconductor used in the device. Thus, conventional LEDs cannot emit white light, or indeed, light of any "mixed" color, which is composed of a mixture of frequencies. Further, producing an LED even of a particular desired "pure" single-frequency color can be difficult, since excellent control of semiconductor chemistry is required.

LEDs of mixed colors, and particularly white LEDs, have many potential applications. Consumers would prefer white light in many displays currently having red or green LEDs. White LEDs could be used as light sources with existing color filter technology to produce full color displays. Moreover, the use of white LEDs could lead to lower cost and simpler fabrication than red-green-blue LED technology. There is currently one technology for producing white LEDs, which combines a blue LED with a yellow phosphor to produce white light. However, color control is poor with this technology, since the colors of the LED and the phosphor cannot be varied. This technology also cannot be used to produce light of other mixed colors.

It has also been proposed to manufacture white or colored LEDs by combining various derivatives of photoluminescent polymers such as poly(phenylene vinylene) (PPVs). One device which has been proposed involves a PPV coating over a blue GaN LED, where the light from the LED stimulates emission in the characteristic color of the PPV, so that the observed light is composed of a mixture of the characteristic colors of the LED and the PPV. However, the maximum theoretical quantum yield for PPV-based devices is 25%, and the color control is often poor, since organic materials tend to fluoresce in rather wide spectra. Furthermore, PPVs are rather difficult to manufacture reliably, since they are degraded by light, oxygen, and water. Related approaches use blue GaN-based LEDs coated with a thin film of organic dyes, but efficiencies are low (see, for example, Guha, et al., *J. Appl. Phys.* 82(8):4126–4128, October 1997; *III-Vs Review* 10(1):4, 1997).

It has also been proposed to produce LEDs of varying colors by the use of quantum dots. Semiconductor nanocrystallites (quantum dots) whose radii are smaller than the bulk exciton Bohr radius constitute a class of materials intermediate between molecular and bulk forms of matter. Quantum confinement of both the electron and hole in all three dimensions leads to an increase in the effective band gap of the material with decreasing crystallite size. Consequently, both the optical absorption and emission of quantum dots shift to the blue (higher energies) as the size of the dots gets smaller. It has been found that a CdSe quantum dot, for example, can emit light in any monochromatic, visible color, where the particular color characteristic of that dot is dependent only on its size.

Currently available light-emitting diodes and related devices which incorporate quantum dots use dots which have been grown epitaxially on a semiconductor layer. This fabrication technique is suitable for the production of infrared LEDs, but LEDs in higher-energy colors have not been achieved by this method. Further, the processing costs of epitaxial growth by currently available methods (molecular beam epitaxy and chemical vapor deposition) are quite high. Colloidal production of dots is a much more inexpensive process, but these dots have generally been found to exhibit low quantum efficiencies, and thus have not previously been considered suitable for incorporation into light-emitting diodes.

A few proposals have been made for embedding colloidally produced quantum dots in an electrically conductive layer, in order to use the electroluminescence of these dots for an LED, but such devices require a transparent, electrically conductive host matrix, which severely limits the available materials for producing LEDs by this method. Available host matrix materials are often themselves light-emitting, which may limit the achievable colors using this method.

SUMMARY OF THE INVENTION

In one aspect, this invention comprises an electronic device, comprising a solid-state light source, and a population of quantum dots disposed in a host matrix. The quantum dots are characterized by a band gap smaller than the energy of at least a portion of the light from the light source. The matrix is disposed in a configuration that allows light from the source to pass therethrough. When the host matrix is irradiated by light from the source, that light causes the quantum dots to photoluminesce secondary light. The color of this light is a function of the size of the quantum dots.

In one embodiment of this aspect, the quantum dots comprise CdS, CdSe, CdTe, ZnS, or ZnSe and may optionally be overcoated with a material comprising ZnS, ZnSe, CdS, CdSe, CdTe, or MgSe. The quantum dots may be further coated with a material having an affinity for the host matrix. The host matrix may be a polymer such as polystyrene, polyimide, or epoxy, a silica glass, or a silica gel. The primary light source may be a light-emitting diode, a solid-state laser, or a solid-state ultraviolet source. The color of the device is determined by the size distribution of the quantum dots; this distribution may exhibit one or more narrow peaks. The quantum dots, for example, may be selected to have no more than a 10% rms deviation in the size of the dots. The light may be of a pure color, or a mixed color, including pure white.

In a related aspect, the invention comprises a method of producing an electronic device as described above. In this method, a population of quantum dots is provided, and these dots are dispersed in a host matrix. A solid-state light source is then provided to illuminate the dots, thereby causing them to photoluminesce light of a color characteristic of their size distribution. The dots may be colloidally produced (i.e., by precipitation and/or growth from solution), and may comprise CdS, CdSe, CdTe, ZnS, or ZnSe. They may further comprise an overcoat comprising ZnS, ZnSe, CdS, CdSe, CdTe, or MgSe. The host matrix may be any material in which quantum dots may be dispersed in a configuration in which they may be illuminated by the primary light source. Some examples of host matrix materials are polymers such as polystyrene, polyimide, or epoxy, silica glasses, or silica gels. Any solid-state light source capable of causing the quantum dots to photoluminesce may be used; some examples are light-emitting diodes, solid-state lasers, and solid-state ultraviolet sources.

It may be desirable to tailor the size distribution of the quantum dots in order to tailor the color of light which is produced by the device. In one embodiment, the dots exhibit no more than a 10% rms deviation in diameter. The light may be of a pure color (corresponding to a monodisperse size distribution of quantum dots), or a mixed color (corresponding to a polydisperse size distribution of quantum dots) including white.

In a further aspect, the invention comprises a quantum dot colloid, in which quantum dots are disposed in a nonconductive host matrix. The quantum dots may be coated with a material having an affinity for the host matrix. When illuminated by a primary source of light of a higher energy than the band gap energy of the dots, the quantum dots photoluminesce in a color characteristic of their size distribution.

In one embodiment, the dots comprise CdS, CdSe, CdTe, ZnS, or ZnSe, optionally overcoated with a material comprising ZnS, ZnSe, CdS, CdSe, CdTe, or MgSe. The nonconductive host matrix may be a polymer such as polystyrene, polyimide, or epoxy, a silica glass, or a silica gel. In one embodiment, the dots are coated with a monomer related to a polymer component of the host matrix. The dots may be selected to have a size distribution exhibiting an rms deviation in diameter of less than 10%; this embodiment will cause the dots to photoluminesce in a pure color.

A related aspect of the invention comprises a prepolymer colloid. In this aspect, the invention comprises a liquid or semisolid precursor material, with a population of quantum dots disposed therein. The colloid is capable of being reacted, for example by polymerization, to form a solid, transparent, nonconductive host matrix. The quantum dots may have been coated with a material having an affinity for the precursor material. The precursor material may be a monomer, which can be reacted to form a polymer. The quantum dots may comprise CdS, CdSe, CdTe, ZnS, or ZnSe, and may optionally be overcoated with a material comprising ZnS, ZnSe, CdS, CdSe, CdTe, or MgSe. The dots may be selected to have a size distribution having an rms deviation in diameter of less than 10%.

In yet another aspect, the invention comprises a method of producing light of a selected color. The method comprises the steps of providing a population of quantum dots disposed in a host matrix, and irradiating the host matrix with a solid-state source of light having an energy high enough to cause the quantum dots to photoluminesce. The quantum dots may comprise CdS, CdSe, CdTe, ZnS, or ZnSe, and may further have an overcoating comprising ZnS, ZnSe, CdS, CdSe, CdTe, or MgSe. The host matrix may comprise polymers such as polystyrene, polyimide, or epoxy, silica glasses, or silica gels.

The host matrix containing the quantum dots may be formed by reacting a precursor material having quantum dots disposed therein (for example by polymerization). Alternatively, two or more precursor materials may be provided, each having a different size distribution of quantum dots disposed therein. These precursors may be mixed and reacted to form a host matrix, or alternatively, they may be layered to form a host matrix having different size distributions of quantum dots in different layers.

As used herein, the phrase "colloidally grown" quantum dots refers to dots which have been produced by precipitation and/or growth from a solution. A distinction between these dots and quantum dots epitaxially grown on a substrate is that colloidally grown dots have a substantially uniform surface energy, while epitaxially grown dots usually have different surface energies on the face in contact with the substrate and on the remainder of the dot surface.

As used herein, the terms "pure" or "monochromatic" color refers to a color which is composed of light of a single frequency. A "mixed" or "polychromatic" color refers to a color which is composed of light of a mixture of different frequencies.

As used herein, a "monomer" is a substance which can be polymerized according to techniques known in the art of materials science, and may include oligomers. A "related monomer" of a polymer is a component monomer of the polymer, or a compound capable of being incorporated into the backbone of the polymer chain.

BRIEF DESCRIPTION OF THE DRAWING

The file of this patent contains at least one drawing executed in color. Copies of this patent with color drawings (s) will be provided by the Patent and Trademark Office upon request and payment of the necessary fee.

The invention is described with reference to the several figures of the drawing, which are presented for the purpose of illustration only, and in which.

DETAILED DESCRIPTION OF PREFERRED EMBODIMENTS

Figure 1:
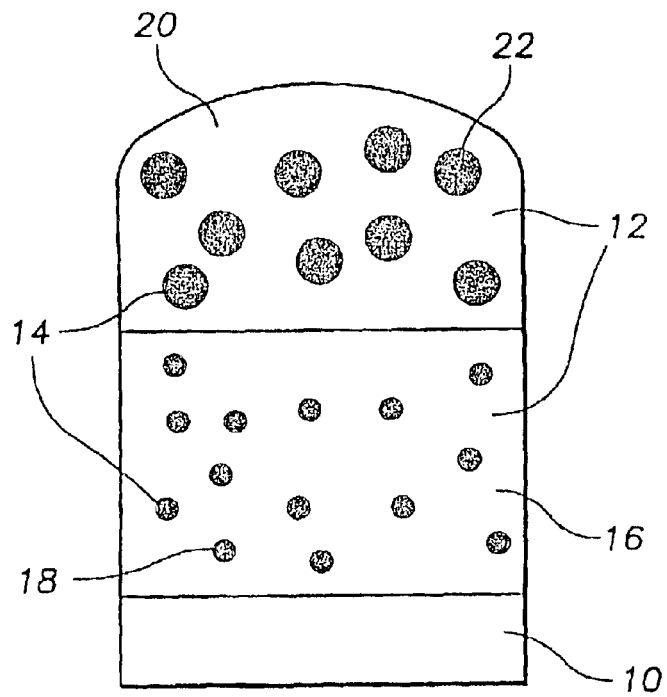
FIG. 1 represents one embodiment of an LED according to the invention.
Figure 2:
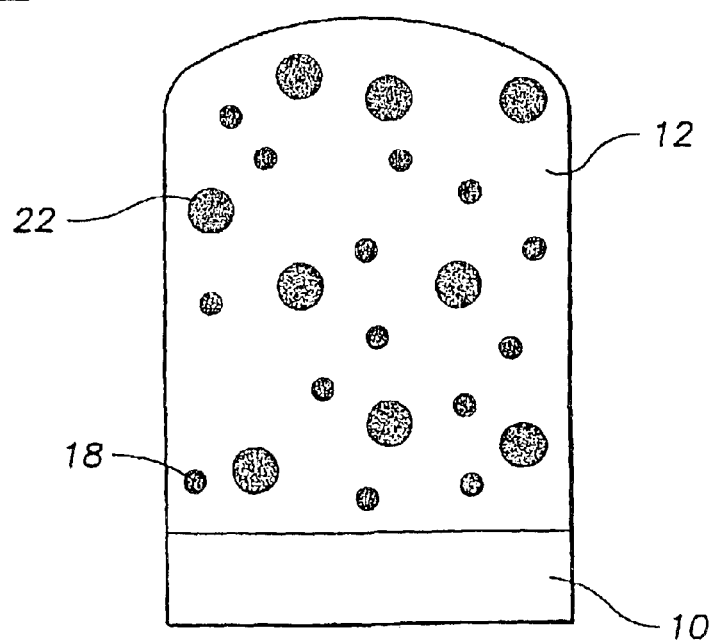
FIG. 2 represents another embodiment of an LED according to the invention.

LEDs of almost any color visible to the human eye can be produced by the techniques of the current invention, using only a single undoped semiconductor material for the quantum dots. Embodiments of the invention are illustrated in FIGS. 1 and 2. In general terms, the invention comprises providing a primary light source 10, for example an LED, a solid-state laser, or a microfabricated UV source. The primary light source 10 is desirably chosen so that its energy spectrum includes light of higher energies than the desired LED color. The primary light source is disposed so as to irradiate a host matrix 12 containing a population of quantum dots 14. The host matrix 12 may be any material at least partially transparent to visible light in which quantum dots can be disposed; suitable host matrices are discussed further below. The host matrix 12 desirably contains a dispersion of isolated quantum dots 14, where the dots have been size selected so as to produce light of a given color. Other configurations of quantum dots disposed in a host matrix, such as, for example, a two-dimensional layer on a substrate with a polymer overcoating, are also contemplated within the scope of the invention. Techniques for producing dots fluorescing brightly in a very narrow spectral distribution of a selected color are discussed further below and in copending U.S. patent application Ser. No. 08/969,302, "Highly Luminescent Color Selective Materials," Bawendi et al, filed Nov. 13, 1997, the teachings of which are incorporated herein by reference; such techniques allow particularly fine color control of the final LED. However, other techniques for producing quantum dots and disposing them in a host matrix are also encompassed within the scope of the invention.

Figure 3:
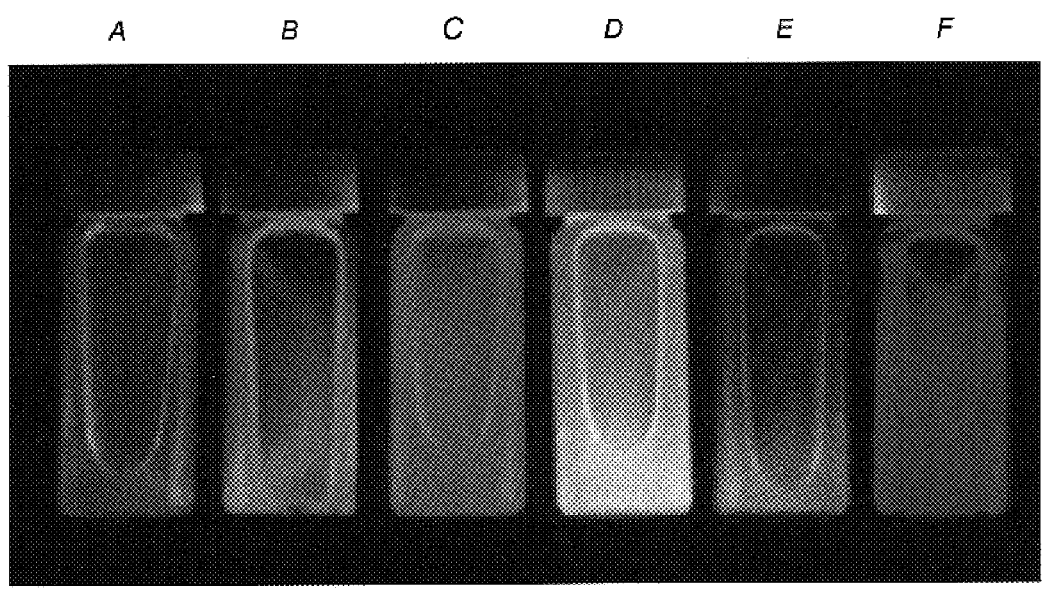
FIG. 3 is a color photograph of several suspensions of quantum dots in hexane, illustrating the wide range of colors that can be achieved by the methods of the invention.

The primary light source 10 and the size distribution of the quantum dots 12 are chosen in such a way that the radiation emitted from the device is of the desired color. The invention may be constructed with a large number of quantum dots, whereby substantially all light from the primary source is absorbed and the finally emitted radiation is produced only by photoluminescence of the quantum dots, or with a smaller number of quantum dots, whereby the light emerging from the device consists of a mixture of unabsorbed primary light and of secondary light produced by photoluminescence of the quantum dots. A very wide range of both pure and mixed colors can be produced by a device constructed according to the principles of the invention. For example, cadmium selenide quantum dots can be produced which will emit in any color visible to the human eye, so that in combination with a source of higher frequency than the highest frequency of the desired color, these dots can be tailored to produce visible light of any spectral distribution. FIG. 3 shows several suspensions of CdSe quantum dots made according to the method of U.S. application Ser. No. 08/969,302, and illustrates the very wide range of colors which can be achieved using the photoluminescence of these materials. The photoluminescent peaks in these solutions are (from left to right) (a) 470 nm, (b) 480 nm, (c) 520 nm, (d) 560 nm, (e) 594 nm, and (f) 620 nm. The solutions are being irradiated by an ultraviolet lamp emitting 356 nm ultraviolet light.

It is usually desirable that the each dot be isolated within the host matrix, particularly when the device is intended to emit light of a mixed color. When quantum dots of different sizes are in close contact, the larger dot, which has a lower characteristic emission frequency, will tend to absorb a large fraction of the emissions of the smaller dot, and the overall energy efficiency of the diode will be reduced, while the color will shift towards the red.

For the particular embodiment of a white LED, such an LED may be produced by combining a combination of sizes of photoluminescent quantum dots with a standard blue LED. Referring to FIG. 1, a blue LED 10, for example of the AlGaInN type, is used to provide primary light. This light passes through a quantum dot layer or layers, where these layers comprise quantum dots adapted to luminesce in a lower-energy range than the blue LED, embedded typically in a polymeric matrix. In the embodiment shown in FIG. 1, the primary light first passes through a layer 16 of quantum dots 18 of a material and size adapted to emit green secondary light. The primary light which has not been absorbed by the first layer and the secondary light then pass through a second layer 20 of quantum dots 22 of a material and size adapted to emit red secondary light. Once the light has passed through this second layer, it will be composed of a mix of unabsorbed blue primary light, green secondary light, and red secondary light, and hence will appear white to the observer. The relative amplitudes of the red, green, and blue components of the light can be controlled by varying the thickness and quantum dot concentrations of the red and green layers to produce an LED of a desired color.

In another preferred embodiment, the red-emitting quantum dots 22 and green-emitting quantum dots 18 can be mixed within a single layer 12, as shown in FIG. 2. The color can be controlled by varying the relative concentrations of the different sizes of quantum dots and the thickness of the layer.

In yet another embodiment, the primary light source may be a solid state violet or ultraviolet source, such as a solid state laser or a microfabricated UV source. In this embodiment, the quantum dot layer(s) may comprise quantum dots emitting in a spectral range ranging from red to violet. By controlling the size distribution of the quantum dots, the spectral distribution of the resulting light may be controlled.

When it is desired to produce an LED of a particular color, rather than a white LED, this also may be accomplished by the practice of the invention. Although the invention is expected to be particularly useful for the manufacture of LEDs producing polychromatic light (mixed colors), which are difficult to produce by traditional methods, LEDs producing monochromatic light (pure colors) may also be produced by the practice of the invention. This may be desirable for purposes of ease of manufacturing, since substantially the same set of equipment is required to produce LEDs of almost any visible color, whether pure or mixed.

The perception of color by the human eye is well understood, and formulae for mixing pure colors to produce any desired mixed color can be found in a number of handbooks. The color of light produced by a particular size and composition of quantum dot may also be readily calculated or measured by methods which will be apparent to those skilled in the art. As an example of these measurement techniques, the band gaps for quantum dots of CdSe of sizes ranging from 12A to 115A are given in Murray, et al., *J. Am. Chem. Soc.* 115:8706 (1993), incorporated herein by reference. These techniques allow ready calculation of an appropriate size distribution of dots and choice of primary light source to produce an LED of any desired color.

When a white diode is desired, an appropriate mix of quantum dot sizes may be used. A white light which appears "clean" to the observer may be achieved, for example, by tailoring the spectral distribution to match a black body distribution.

When a colored LED such as the blue AlGaInN LED described above is used as the primary light source, the color of that LED may or may not be included in the final spectrum produced by the device according to the invention, depending on the concentration of the quantum dots. If a sufficiently large number of quantum dots is provided, the dots will absorb substantially all of the primary light, and only secondary light in the characteristic colors of the dots will be observed. If a smaller number of quantum dots is provided, a significant quantity of primary light may be mixed with the secondary light emitted by the dots.

The host matrix will typically be a polymer, a silica glass, or a silica gel, but any material which is at least somewhat transparent to the light emitted by the quantum dots and in which quantum dots can be dispersed may serve as the host matrix. An advantage of the present invention compared to light-emitting diodes based on electroluminescence of quantum dots, rather than photoluminescence, is that the host matrix need not be electrically conductive. Electroluminescent quantum dot LEDs require a transparent, electrically conductive material to serve as the host matrix. Such materials are rare, compared to the very large number of transparent insulator materials available for use with the present invention. Suitable host matrix materials for the devices described herein include many inexpensive and commonly available materials, such as polystyrene, epoxy, polyimides, and silica glass.

A further advantage of the present invention is the manufacturing flexibility afforded by the use of multiple populations of quantum dots to achieve both pure and mixed colors of light. "Stock" solutions of different sizes of dots suspended in a monomer or other precursor material can be maintained, and mixed in varying amounts to produce almost any desired color. For example, three suspensions of CdSe quantum dots in a liquid monomer such as styrene could be produced: a first suspension of dots of approximately 5.5 nm diameter (which will luminesce in the red), a second suspension of dots of approximately 4.0 nm diameter (which will luminesce in the green), and a third suspension of dots of approximately 2.3 nm diameter (which will luminesce in the blue). These suspensions function as a kind of "light paint"; by mixing varying amounts of these three suspensions, and polymerizing the resulting mixture, LEDs of a very wide range of colors can be produced using the same manufacturing techniques, varying only the starting materials.

It will usually be found to be necessary to coat colloidally produced dots with a coating which enables them to be dispersed in the host matrix without flocculation. In the case of dispersal in a polymeric matrix, an oligomer related to the polymer, with a Lewis base at the end of the oligomer which is bound to the dots, has been found to allow good mixing of dots into a monomer solution for polymerization. Particular cases of this type of coating may be found in the Examples. In the case of dispersal into a silica glass or gel, any overcoating which will bind at one end to the dot, and whose other end has an affinity for the matrix, may be used.

A number of methods of producing quantum dots are known in the art. Any method of producing quantum dots which will fluoresce in the desired colors may be used in the practice of the invention, but it has been found that the particular methods described in U.S. application Ser. No. 08/969,302 can be used to produce devices with excellent brightness and color control. That application discloses a method of overcoating dots composed of CdS, CdSe, or CdTe with ZnS, ZnSe, or mixtures thereof. Before overcoating, the quantum dots are prepared by a method yielding a substantially monodisperse size distribution, which is described in Murray, et al., *J. Am. Chem. Soc.* 115:8706 (1993). An overcoat of a controlled thickness can then be applied by controlling the duration and temperature of growth of the coating layer. The monodispersity of the core dots ensures that the dots will radiate substantially in a pure color, while the overcoat provides a much improved quantum efficiency, allowing the dots to fluoresce more brightly than do uncoated dots.

The above method can be used to prepare several separate populations of quantum dots, where each population exhibits photoluminescence in a different pure color. By mixing the populations so prepared, a device which fluoresces in any desired mixed color, including white, may be produced. The overcoating on the dots allows the device to produce a brighter light than would be possible using uncoated dots.

EXAMPLE 1

Quantum Dots in Polystyrene

A green LED has been constructed according to the principles of the invention described above. The quantum dots used to construct this diode were composed of a CdSe core and a ZnS shell. The absorption and luminescence properties of the quantum dots were primarily determined by the size of the CdSe core. The ZnS shell acted to confine electrons and holes in the core and to electronically and chemically passivate the quantum dot surface. Both the core and shell were synthesized using wet chemistry techniques involving formation of CdSe or ZnS from precursors added to a hot organic liquid.

CdSe Core Synthesis 16 mL of trioctylphosphine (TOP), 4 mL of 1 M trioctylphosphine selenide (TOPSe) in TOP, and 0.2 mL dimethylcadmium were mixed in an inert atmosphere (nitrogen filled glovebox). 30 g of trioctylphosphine oxide (TOPO) was dried under vacuum at 180° C. for 1 hour, and then heated to 350° C. under nitrogen. The precursor solution was then injected into the TOPO. The temperature immediately fell to about 260° C. and CdSe nanocrystals immediately formed. The absorption peak of the nanocrystals right after injection was found to be around 470 nm. The temperature was held at 250–260° C. for about 10–15 minutes, allowing the nanocrystals to grow. During this time, the absorption peak shifted from 470 nm to 490 nm. The temperature was then dropped to 80° C. and held with the solution under nitrogen. The heat was removed and about 15 mL butanol was added to prevent solidification of the TOPO as it cooled to room temperature. This process produced $2.7 \times 10^{-3}$ mol (2.7 mmol) of CdSe quantum dots.

The UV-Vis absorption spectrum of the CdSe nanocrystals showed a first transition peak at 486 nm with a half-width half-max (HWHM), measured on the red side of the peak, of 14 nm. This absorption peak corresponded to a nanocrystal radius of 13 angstroms. The actual size distribution can be determined experimentally via small angle x-ray scattering or TEM. The absorption spectrum gave a rough estimate of the size distribution. The 14 nm HWHM suggested a size HWHM of about 1 angstrom.

ZnS Shell Synthesis

One-fifth (0.5 mmol) of the CdSe core growth solution (15 mL) was used to produce the coated quantum dots. The nanocrystals were precipitated out of the solution by slowly adding 40–50 mL of methanol. The precipitate was then redispersed in hexane and filtered with 0.2 micron filter paper. 40 g of TOPO was dried as described above and then cooled to 80° C. The nanocrystals in hexane were injected into the TOPO, and the hexane was evaporated under vacuum for 2 hours. A ZnS precursor solution was then prepared in an inert atmosphere, by mixing 4 mL of TOP, 0.28 mL of diethylzinc, and 0.56 mL of bis-trimethylsilyl sulfide $(TMS)_2S$. The amounts of precursor were chosen to produce a ZnS shell thickness of about 9 angstroms, which corresponds to 4 monolayers at 2.3 angstroms/monolayer. The nanocrystal/TOPO solution was then heated to 140° C., and the precursor solution was dripped in slowly over 4 minutes. The temperature was then reduced to 100° C. and held for at least two hours. Heat was removed and butanol added to prevent solidification of the TOPO.

The UV-Vis absorption spectrum of the overcoated quantum dots showed the first transition peak at 504 nm with a HWHM measured on the red side of the peak of 20 nm. The photoluminescence peak was at 550 nm.

Dispersal of Quantum Dots in Polymer

These quantum dots are then dispersed in poly(styrene). One-fifth (0.1 mmol CdSe) of the quantum dots in TOPO solution produced as described above was taken. The quantum dots were precipitated and then dispersed in hexane as described above. One-fifth (0.02 mmol CdSe) of the quantum dots in hexane solution were then taken and the hexane evaporated under vacuum. The quantum dots were redispersed in 0.1 mL of toluene. 0.05 g of n-functionalized, amine-terminated polystyrene (molecular weight=2600) was dissolved in 0.2 mL toluene. 0.05 mL of toluene solution containing quantum dots (0.01 mmol CdSe) and 0.05 mL functionalized polystyrene in toluene (about 0.01 g) were mixed together and sonicated for about 10 minutes. A solution of 1 g polystyrene (molecular weight=45,000) in 1 mL of toluene was prepared. 0.1 mL of this concentrated polystyrene solution (about 0.05 g polystyrene) was added to the quantum dot/functionalized-polystyrene solution. The resulting solution was sonicated for 2 minutes to thoroughly mix the dots and polystyrene.

Production of Diode

The blue diode used as a primary light source was GaN based and had a luminescence peak at 450 nm. The glass cap was a shortened, thin-walled NMR tube (OD=5 mm, ID=4.3 mm, length=3/16"). The glass cap was filled with the dot/polymer solution and allowed to dry under flowing nitrogen for over two hours. More dot/polymer solution could be added and dried as needed, but only one filling and drying step was needed for this diode. When dried, the polymer left a void at the base of the cap. The emitting portion of the blue diode was then placed in this void at the base of the cap. The polymer itself did not contact the diode. Green light was produced as the blue light from the GaN based diode passed through the quantum dot-containing polymer, causing the quantum dots to luminesce at 550 nm. The 550 nm light gave the diode a green appearance.

EXAMPLE 2

Quantum Dots in Epoxy

CdSe/ZnS quantum dots having a 14A core radius were prepared as described in Example 1. $2.5 \times 10^{-3}$ mmol of dots in TOPO solution were taken, and the dots were precipitated and washed 2 times with methanol. The dots were then redispersed in 0.27 mL (2 mmol) of a capping monomer, 6-mercaptohexanol. In order to effectively disperse the quantum dots in the capping monomer, the solutions were first sonicated for about 10 minutes and then stirred for 2 hours at 50–60° C.

The quantum dot solution was then further reacted with epoxide monomers. 0.56 mL (2 mmol) of poly[{phenyl glycidylether)-co-formaldehyde] (number average molecular weight=345) and 0.08 mL (0.8 mmol) of diethyltriamine were added to the 6-mercaptohexanol solution. The resulting mixture was thoroughly mixed and placed in a glass tube having an outside diameter of 6 mm and a length of 50 mm. Air bubbles formed during mixing were removed by sonicating for 10 minutes. The glass tube containing the monomer mixture was then heated to 70° C. in an oil bath for 2 hours, forming a high molecular weight epoxy with the quantum dots distributed therein. This formed composite could then be used as described in Example 1 with a primary light source to make a green LED.

Other embodiments of the invention will be apparent to those skilled in the art from a consideration of the specification or practice of the invention disclosed herein. It is intended that the specification and example be considered as exemplary only, with the true scope and spirit of the invention being indicated by the following claims.

What is claimed is:

1. A prepolymer colloid, comprising:
    a liquid or semisolid precursor material capable of being reacted to form a solid, transparent, substantially nonconductive host matrix; and
    a population of photoluminescent quantum dots of a selected size distribution dispersed in the precursor material, each dot of said population having a substantially uniform surface energy.

2. The colloid of claim 1, where the precursor material is a monomer which is capable of being reacted to form a polymer.

3. The colloid of claim 2, where the precursor material comprises a monomer selected from the group consisting of styrene, acids, peroxides, anhydrides, amines, and alcohols.

4. The colloid of claim 1, where the quantum dots comprise at least one material selected from the group consisting of CdS, CdSe, CdTe, ZnS, and ZnSe.

5. The colloid of claim 4, where the quantum dots further comprise an overcoating of at least one material selected from the group consisting of ZnS, ZnSe, CdS, CdSe, CdTe, and MgSe.

6. The colloid of claim 1, where the quantum dots are coated with a material having an affinity for the precursor material.

7. The colloid of claim 1, where the size distribution is characterized by an rms deviation in diameter of the quantum dots of less than 10%.

* * * * *